United States Patent
Fukushima

(10) Patent No.: US 8,329,057 B2
(45) Date of Patent: *Dec. 11, 2012

(54) WORKING LIQUID FOR LATENT HEAT TRANSPORT APPARATUS AND METHOD FOR OPERATING LATENT HEAT TRANSPORT APPARATUS

(75) Inventor: Masato Fukushima, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 1029 days.

This patent is subject to a terminal disclaimer.

(21) Appl. No.: 12/233,635

(22) Filed: Sep. 19, 2008

(65) Prior Publication Data

US 2009/0020267 A1  Jan. 22, 2009

Related U.S. Application Data

(63) Continuation of application No. PCT/JP2007/057683, filed on Apr. 5, 2007.

(30) Foreign Application Priority Data

Apr. 6, 2006 (JP) .................... 2006-105312

(51) Int. Cl.
*C09K 5/04* (2006.01)
(52) U.S. Cl. ............... 252/67; 60/670; 570/134
(58) Field of Classification Search ........... 252/67; 60/670; 570/134
See application file for complete search history.

(56) References Cited

U.S. PATENT DOCUMENTS

| 2,490,764 | A | * | 12/1949 | Benning et al. | 570/134 |
| 5,277,834 | A | * | 1/1994 | Bivens et al. | 252/67 |
| 5,700,388 | A | * | 12/1997 | Shiflett et al. | 252/67 |
| 5,800,729 | A | * | 9/1998 | Wilson et al. | 252/67 |
| 6,299,792 | B1 | * | 10/2001 | Feiring et al. | 252/68 |
| 6,852,684 | B1 | * | 2/2005 | Westbrook et al. | 510/410 |
| 2008/0161221 | A1 | * | 7/2008 | Okamoto et al. | 510/411 |
| 2009/0301090 | A1 | * | 12/2009 | Fukushima | 60/670 |

FOREIGN PATENT DOCUMENTS

| CN | 1136065 A | | 11/1996 |
| CN | 1302839 A | | 7/2001 |
| JP | 59-12288 | | 1/1984 |
| JP | 02240186 A | * | 9/1990 |
| JP | 2-272086 | | 11/1990 |
| JP | 02-272086 | | 11/1990 |
| JP | 6-145081 | | 5/1994 |
| JP | 7-18296 | | 1/1995 |
| JP | 2726542 | | 5/1997 |
| JP | 2001-509180 | | 7/2001 |
| WO | WO 2005007771 A1 | * | 1/2005 |

(Continued)

OTHER PUBLICATIONS

CAS reg. 80793-17-5, Nov. 16, 1984.*

(Continued)

*Primary Examiner* — Douglas McGinty
(74) *Attorney, Agent, or Firm* — Oblon, Spivak, McClelland, Maier & Neustadt, L.L.P.

(57) ABSTRACT

A method for operating a latent heat transport apparatus by providing a working liquid for a latent heat transport apparatus, which includes a compound of the formula $C_6F_{13}C_2H_5$ at an operation temperature of from −50 to 200° C.

13 Claims, 1 Drawing Sheet

FOREIGN PATENT DOCUMENTS

WO    WO 2005008819 A2 *  1/2005
WO    WO 2007032211 A  *  3/2007

OTHER PUBLICATIONS

Office Action issued Aug. 13, 2010 in Chinese Application No. 2007800123692 (with English translation).

Office Action issued Feb. 23, 2012 in China Application No. 200780012369.2 (With English Translation).

Office Action as received in the corresponding Japanese Patent Application No. 2008-508723 dated Apr. 24, 2012 w/English Translation.

* cited by examiner

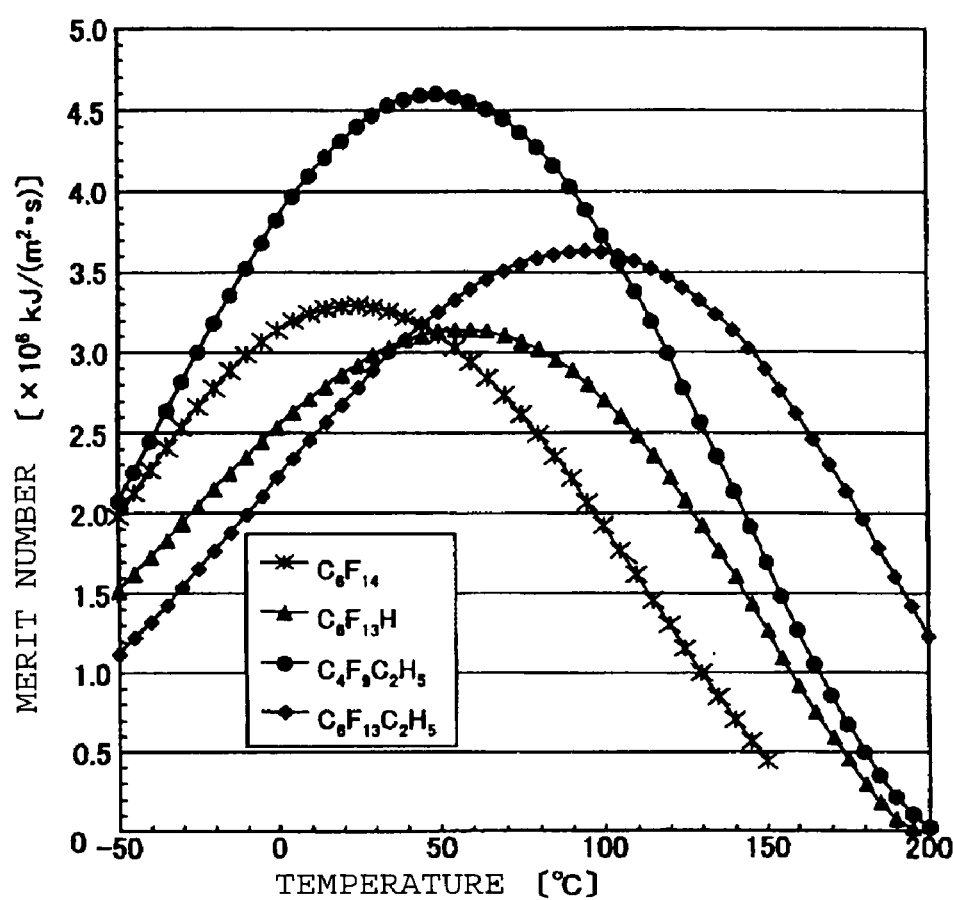

WORKING LIQUID FOR LATENT HEAT TRANSPORT APPARATUS AND METHOD FOR OPERATING LATENT HEAT TRANSPORT APPARATUS

CROSS REFERENCE TO RELATED APPLICATIONS

The present application is the bypass continuing application of international application PCT/JP2007/057683, filed on Apr. 5, 2007, and claims the benefit of the filing date of Japanese Application No. 2006-105312, filed on Apr. 6, 2006.

TECHNICAL FIELD

The present invention relates to a working liquid for a latent heat transport apparatus and a method for operating a latent heat transport apparatus which employs the working liquid.

BACKGROUND ART

Latent heat transport apparatuses have been known wherein latent heat transport is carried out by utilizing phenomena of evaporation, boiling, condensation, etc. of a working liquid sealed into the apparatuses. The latent heat transport apparatus may, for example, be a heat pipe or a double phase closed type heat siphon. The heat pipe is an apparatus which transports heat by utilizing capillary force obtained by an internally installed wig (capillary structure), and the double phase closed type heat siphon is an apparatus which transports heat by utilizing gravity and centrifugal force. They are characterized in that a working liquid can be circulated without using an external power such as a pump.

The heat pipe is applied to relatively small refrigerators such as refrigerators for semiconductor devices or electronic equipments, and since the double phase closed type heat siphon does not require a wig and has a simple structure, it is widely used for gas-gas heat exchangers or for accelerating snow melt on road, cryoprotection, etc.

Now, properties required for a working liquid will be described with reference to a heat pipe as an example.

The heat pipe is a heat transport device, wherein one terminal of a pipe container is an evaporation part, and the other terminal is a condensation part. In general, heat transport characteristics of a heat pipe depend on a working liquid contained in the main body of the heat pipe. In general, when it is used under normal pressure at about the boiling point, excellent characteristics are shown.

The mechanism of the heat pipe is simple. If one terminal of a pipe is heated, the working liquid evaporates there and absorbs heat. Evaporated gas diffuses in the pipe, emits latent heat at the other terminal (low temperature part) and is condensed to a liquid. The liquid returns to one terminal (high temperature part) by gravity or capillary force, whereby heat is transferred from the high temperature part to the low temperature part.

The heat pipe mainly comprises three elements: (1) working liquid, (2) wig or capillary structure and (3) vessel or container. Characteristics required for the working liquid are as mentioned below. However, the operation vapor temperature range is the most important.

(1) conformity to a wig or container material
(2) excellent heat stability
(3) excellent wettability to a wig or container material (contact angle is 0 or extremely low)
(4) vapor pressure is not too high or too low within the operation temperature range
(5) large evaporation latent heat
(6) high heat conductivity
(7) low viscosity in both gas and liquid phases
(8) strong surface tension
(9) appropriate freezing point or appropriate melting point In general, as a characteristic value to determine the maximum heat transport amount, merit number M (kJ/(m²·s) represented by the following formula 2 is used. The larger the merit number is, the larger the maximum heat transport amount of the working liquid becomes.

$$M = \rho \sigma L / \mu \quad \text{Formula 2,}$$

wherein $\rho$ is the density of the working liquid (kg/m³), $\sigma$ is the surface tension of the working liquid (N/m), L is the evaporation latent heat of the working liquid (kJ/kg), and $\mu$ is the viscosity of the working liquid (Pa·s).

The merit number is variable depending on the temperature.

Heretofore, as the working liquid for heat pipes, water, ammonia, methanol, a chlorofluorocarbon (CFC), a hydrochlorofluorocarbon (HCFC), etc. are used. However, in the case of water, there is a problem of freezing in cold district. Whereas, in the case of ammonia, not only conformity with a heat pipe container is required, but also handling is cumbersome due to a bad smell and toxicity. In the case of methanol, there is a problem of corrosion of an aluminum or stainless steel container. Further, CFC and HCFC are inhibited compounds, since they destroy an ozone layer.

In order to solve the above problems, the following methods have been proposed.

For example, in Patent Document 1, it has been proposed to use n-perfluorohexane as a working fluid for heat pipes or heat siphons. Further, in Patent Document 2, a working liquid for heat pipes containing at least 95% of a perfluorocarbon such as $C_6F_{14}$ and at most 1% of a fluorocarbon compound having a lower boiling point than the perfluorocarbon has been proposed. However, heat conductivities of these working liquids are poor, and there is a problem of global warming.

Patent Document 1: JP-A-59-12288 (claims)
Patent Document 1: JP 2726542 (claims)

DISCLOSURE OF THE INVENTION

It is an object of the present invention to provide a working liquid for a latent heat transport apparatus which is free from environmental problems such as destruction of an ozone layer and global warming and of which shows a high performance constantly at an operation temperature of from −50 to 200° C.

MEANS FOR SOLVING THE PROBLEMS

The present invention provides the following.
1. A working liquid for a latent heat transport apparatus, which comprises a compound represented by the following formula 1:

$$C_nF_{2n+1}\text{—}C_mH_{2m+1} \quad \text{Formula 1,}$$

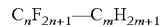

wherein n is an integer of from 2 to 8, and m is an integer of from 1 to 3.
2. The working liquid for a latent heat transport apparatus according to the above 1, wherein the content of the compound represented by the formula 1 is at least 50 mass %.
3. The working liquid for a latent heat transport apparatus according to the above 1 or 2, wherein the compound represented by the formula 1 is $C_4F_9C_2H_5$ (1,1,1,2,2,3,3,4,4-nonafluorohexane) or $C_6F_{13}C_2H_5$ (1,1,1,2,2,3,3,4,4,5,5,6,6-tridecafluorooctane).

4. The working liquid for a latent heat transport apparatus according to the above 1, 2 or 3, which contains a $C_{1-4}$ alcohol.
5. The working liquid for a latent heat transport apparatus according to the above 4, which is a composition containing the compound represented by the formula 1 and a $C_{1-4}$ alcohol, wherein the content of the compound represented by the formula 1 is from 90 to 99 mass %, and the content of the alcohol is from 1 to 10 mass %.
6. The working liquid for a latent heat transport apparatus according to the above 4 or 5, wherein the $C_{1-4}$ alcohol is at least one selected from the group consisting of methanol, ethanol, 1-propanol, 2-propanol and n-butanol.
7. The working liquid for a latent heat transport apparatus according to any one of the above 1 to 6, which contains at least one stabilizer selected from the group consisting of an antioxidant, a heat resistant agent and a metal deactivator.
8. A method for operating a latent heat transport apparatus which employs the working liquid as defined in any one of the above 1 to 7, characterized in that the operation temperature is from −50 to 200° C.
9. The method for operating a latent heat transport apparatus according to the above 8, wherein the latent heat transport apparatus is a heat pipe.

EFFECTS OF THE INVENTION

The working liquid for a latent heat transport apparatus of the present invention has a relatively high merit number and is remarkably excellent in heat conductivity, as compared to conventional working liquids. Further, the working liquid for a latent heat transport apparatus of the present invention has a high antioxidation property and anti-corrosion property to stainless steel or aluminum used as a material of latent heat transport apparatuses. Further, it has an advantage that it can be used for conventional systems as it is. Further, it is free from environmental problems such as destruction of an ozone layer and global warming.

BRIEF DESCRIPTION OF THE DRAWING

FIG. 1 is a graph which shows the relationship between the merit number of each working liquid and the operation temperature.

BEST MODE FOR CARRYING OUT THE INVENTION

The present invention is a working liquid for a latent heat transport apparatus. The latent heat transport apparatus is an apparatus which transports latent heat by utilizing phenomena of evaporation, boiling, condensation, etc. of a working liquid sealed in the apparatus. The typical apparatus may, for example, be a heat pipe or a double phase closed type heat siphon.

The working liquid of the present invention comprises a compound represented by the following formula 1:

$$C_nF_{2n+1}-C_mH_{2m+1} \quad \text{Formula 1,}$$

wherein n is an integer of from 2 to 8, and m is an integer of from 1 to 3.

The compound represented by the above formula 1 is excellent as a working liquid, since it has a large heat transport amount, low viscosity, low freezing point, appropriate vapor pressure and is incombustible, highly stable, excellent in conformity with general materials, and not corrosive to articles to be contacted therewith.

The compound represented by the formula 1 may be linear or branched, however, the linear compound is preferred.

The compound represented by the formula 1 is preferably a compound wherein n is an integer of from 4 to 6, and m is 2, and specifically, $C_4F_9C_2H_5$ and $C_6F_{13}C_2H_5$ are preferred.

In the working liquid of the present invention, the content of the compound represented by the formula 1 is preferably at least 50 mass %, particularly preferably at least 80 mass %, more preferably at least 90 mass %.

Further, other components contained in a case where the content of the compound represented by the formula 1 is less than 100 mass %, are preferably at least one member selected from the group consisting of a hydrocarbon, a halogenated hydrocarbon (except the compound represented by the formula 1), an alcohol, a fluoroalcohol, a ketone and a fluoroether. Particularly, in a case where the hydrocarbon or the alcohol is contained, the merit number of the working liquid becomes high.

In a case where the working liquid of the present invention contains such other components, the composition of the working liquid is preferably an azeotropic composition or an azeotropic like composition in order to suppress evaporation of the working liquid, temperature change at a time of freezing and composition change of both gas and liquid phases and secure stable operation conditions.

Here, the azeotropic like composition means a composition ratio wherein the temperature difference between the dew point and the boiling point is within 0.5° C. Particularly, one wherein the vapor temperature difference is within 0.1° C. is especially preferred.

The hydrocarbon is preferably a $C_{6-8}$ chain (linear or branched) or cyclic saturated hydrocarbon. Further, specifically, the hydrocarbon may, for example, be n-pentane, cyclopentane, n-hexane or n-heptane.

In a case where the working liquid of the present invention contains a hydrocarbon, the content of the hydrocarbon is preferably from 0.5 to 50 mass %, particularly preferably from 1 to 10 mass % from the viewpoint of increasing the merit number of the working liquid.

The above halogenated hydrocarbon is preferably a $C_{1-4}$ saturated chlorohydrocarbon or a $C_{2-3}$ unsaturated chlorohydrocarbon. Specifically, the halogenated hydrocarbon may, for example, be a hydrochlorofluorocarbon (hereinafter referred to as HCFC) such as 1,1-dichloro-2,2,3,3,3-pentafluoropropane, 1,3-dichloro-1,1,2,2,3-pentafluoropropane; a hydrofluorocarbon (hereinafter referred to as HFC) such as difluoromethane, 1,1,1,2,2-pentafluoroethane, 1,1,1,2-tetrafluoroethane, 1,1,1-trifluoroethane, 1,1-difluoroethane, 1,1,1,2,3,3,3-heptafluoropropane, 1,1,1,2,2,3,3-heptafluoropropane, 1,1,1,3,3,3-hexafluoropropane, 1,1,1,3,3-pentafluoropropane, 1,1,2,2,3-pentafluoropropane, 1,1,1,3,3-pentafluorobutane, 1,1,1,2,2,3,4,5,5,5-decafluoropentane or 1,1,2,2,3,3,4-heptafluorocyclopentane; a chlorocarbon (hereinafter referred to as CC) such as methylene chloride or trichloroethylene; or 1-bromopropane.

The above halogenated hydrocarbon is contained in order to drop the freezing point or increase the merit number, and its content is preferably from 0.1 to 50 mass %, particularly preferably from 0.5 to 20 mass %.

The above alcohol is a $C_{1-4}$ alcohol, preferably a $C_{1-3}$ alcohol. Specifically, at least one alcohol selected from the group consisting of methanol, ethanol, 1-propanol, 2-propanol and n-butanol may be mentioned.

In a case where the working liquid of the present invention contains an alcohol, advantages such that the merit number can be remarkably increased with a low content of alcohol, it is incombustible, etc. can be obtained. The content of the alcohol is preferably from 0.5 to 15 mass %, particularly preferably from 1 to 10 mass %.

The composition of the working liquid of the present invention preferably comprises the compound represented by the formula 1 and a $C_{1-4}$ alcohol, preferably a $C_{1-3}$ alcohol, and a composition wherein the content of the composition represented by the formula 1 is from 85 to 99.5 mass %, preferably 90 to 99 mass %, and the content of the alcohol is from 0.5 to 15 mass %, preferably from 1 to 10 mass %, is preferred.

Among them, the $C_{1-4}$ alcohol is particularly preferably at least one selected from the group consisting of methanol, ethanol, 1-propanol, 2-propanol and n-butanol.

Next, the above fluoroalcohol is a $C_{2-4}$, preferably $C_{3-4}$ partially fluorinated alcohol, and specifically, 2,2,2-trifluoroethanol or 2,2,3,3-tetrafluoropropanol may, for example, be mentioned.

The content of the fluoroalcohol is from 0.5 to 20 mass %, particularly preferably from 1 to 15 mass %.

Further, the above ketone is preferably a $C_3$ ketone, and specifically, acetone may be mentioned.

Further, the above fluoroether is preferably a compound represented by the formula $C_aF_{2a+1}$—O—$C_bH_{2b+1}$ (a is an integer of from 1 to 6, preferably an integer of from 2 to 4, and b is an integer of from 1 to 4, preferably an integer of from 1 to 3). $C_3F_7OCH_3$, $C_4F_9OCH_3$ or $C_4F_9OC_2H_5$ is particularly preferred. Further, $CF_3CH_2OCHF_2$ (HFE-245mf), $CF_3CF_2CH_2OCHF_2$ (HFE-347mcf), $CHF_2CF_2OCH_2CF_3$ (HFE-347 pc-f), $CF_3CHFCF_2OCH_2CF_3$ (HFE-449mec-f), $CF_3CHFCF_2OCH_2CF_2CHF_2$ (HFE-55-10mec-fc) or the like may be used.

The content of the above fluoroether is preferably from 0.1 to 50 mass %, particularly preferably from 1 to 20 mass %.

Although the working liquid of the present invention is highly stable against heat or oxides, as it is, if it contains a stabilizer such as an antioxidant, a heat resistant agent or a metal deactivator, each stability can be remarkably improved. The above stabilizer is preferably contained, as a case requires.

The above stabilizer can be added within such a content that the performance of the working liquid for heat pipe is not harmed, and it is usually at most 5 mass %, preferably at most 1 mass % in the working liquid.

Specifically, the antioxidant or the heat resistant agent may, for example, be N,N'-diphenylphenylenediamine, p-octyldiphenylamine, p,p'-dioctyldiphenylamine, N-phenyl-1-naphtylamine, N-phenyl-2-naphtylamine, N-(p-dodecyl)phenyl-2-naphtylamine, di-1-naphtylamine, di-2-naphtylamine, N-alkylphenothiazine, 6-(t-butyl)phenol, 2,6-di-(t-butyl)phenol, 4-methyl-2,6-di-(t-butyl)phenol or 4,4'-methylenebis(2,6-di-t-butylphenol, and a mixture containing at least two such compounds may be mentioned.

Specifically, the metal deactivator may, for example, be imidazole, benzimidazole, 2-mercaptobenzimidazole, 2,5-dimethylcaptothiadiazole, salysine-propylene diamine, pyrazole, benzotriazole, tolutriazole, 2-methylbenzoimidazole, 3,5-dimethylpyrazole and methylene bis-benzotriazole may, for example, be mentioned.

A latent heat transport apparatus which employs the working liquid of the present invention can be operated at the working temperature of from −50 to 200° C. In a case where the working liquid of the present invention is used, high performance can be realized stably within the above temperature range. If the operation temperature is from 0 to 150° C., higher performance can be realized.

EXAMPLES

Now, the present invention will be described in further detail with reference to Examples. However, it should be understood that the present invention is by no means restricted to such specific Examples.

Calculation of the Merit Number at from −50 to 200° C.

The merit numbers of the following working liquids were calculated in accordance with the formula 2. The results are shown in FIG. 1.

Example 1

Example of the Present Invention the working liquid is $C_4F_9C_2H_5$

Example 2

Example of the Present Invention the working liquid is $C_6F_{13}C_2H_5$

Example 3

Comparative Example the working liquid is $C_6F_{14}$ (n-perfluorohexane)

Example 4

Comparative Example the working liquid is $C_6F_{13}H$

From FIG. 1, it is evident that $C_4F_9C_2H_5$ in example of the present invention has a higher merit number than $C_6F_{14}$ (n-perfluorohexane) and $C_6F_{13}H$ in comparative examples within the entire operation temperature range. On the other hand, $C_6F_{13}C_2H_5$ has a higher merit number than $C_6F_{14}$ (n-perfluorohexane) and $C_6F_{13}H$ in comparative examples within the operation temperature range of at least 50° C., and particularly, $C_6F_{13}C_2H_5$ has the highest merit number in a high temperature region of at least about 110° C.

Namely, it is considered that in examples of the present invention wherein $C_4F_9C_2H_5$ and/or $C_6F_{13}C_2H_5$ were used as a working liquid, excellent heat conductivity was realized.

Calculation of the Merit Number at 25° C. and Normal Boiling Point

The merit numbers at 25° C. and the merit number at a normal boiling points of the working liquids shown in Table 1 were calculated.

Examples 5 to 10 are Examples of the present invention, and Examples 11 to 14 are Comparative Examples. Further, the working liquids in Examples 7, 8, 13 and 14 are azeotropic like compositions.

Further, the normal boiling points in Examples 9 and 10 are estimated values.

It is evident that each working liquid of the present invention in Examples 5 and 6 has a high merit number and remarkably higher heat transport amount than conventional working liquids in Examples 11 and 12.

Further, it is evident that when an alcohol was added as in Examples 7, 8 and 10, or a hydrocarbon was added as in Example 9, the merit number was further increased. Particularly, in Examples 7, 8 and 10, which are Examples of the present invention, the merit number was remarkably increased, as compared to Examples 13 and 14, which are Comparative Examples, and the normal boiling point was higher than that in comparative examples in any condition, and thus it is evident that the present invention has remarkably large heat transport amount.

TABLE 1

| Working liquid number Ex. in ( ) represents mass % | Merit number at 25° C. (kJ/(m$^2$·s)) | Merit number at normal boiling point (kJ/(m$^2$·s)) | Normal boiling point (° C.) |
|---|---|---|---|
| 5  $C_4F_9C_2H_5$ (100) | 4.41 × 10$^6$ | 4.49 × 10$^6$ | 67.5 |
| 6  $C_6F_{13}C_2H_5$ (100) | 2.79 × 10$^6$ | 3.54 × 10$^6$ | 114 |
| 7  $C_4F_9C_2H_5$ (91)/ethanol (9) | 6.72 × 10$^6$ | 6.97 × 10$^6$ | 57.5 |
| 8  $C_4F_9C_2H_5$ (90.3)/2-propanol (9.7) | 5.25 × 10$^6$ | 6.44 × 10$^6$ | 60.2 |
| 9  $C_4F_9C_2H_5$ (90)/n-heptane (10) | 5.32 × 10$^6$ | 5.32 × 10$^6$ | 65 |
| 10 $C_6F_{13}C_2H_5$ (90)/2-propanol (10) | 3.82 × 10$^6$ | 5.58 × 10$^6$ | 107 |
| 11 $C_6F_{14}$ (100) | 3.29 × 10$^6$ | 3.00 × 10$^6$ | 56.7 |
| 12 $C_6F_{13}H$ (100) | 2.93 × 10$^6$ | 3.10 × 10$^6$ | 70.8 |
| 13 $C_6F_{13}H$ (91.3)/ethanol (8.7) | 5.07 × 10$^6$ | 5.40 × 10$^6$ | 61 |
| 14 $C_6F_{13}H$ (90.9)/2-propanol (9.1) | 4.05 × 10$^6$ | 4.93 × 10$^6$ | 64 |

Application to Cooling of Laptop Computer

A specific example that the working liquid of the present invention contained in a small heat pipe is applied to cool a laptop computer will be explained.

An inner surface of a copper pipe having a diameter of 1.5 mm and a length of 20 cm is equipped with a mesh structure of stainless steel, and $C_4F_9C_2H_5$ (Example 1) as a working liquid is sealed in the pipe. One terminal of the pipe has a function as an evaporation part and is in contact with a CPU (Central Processing Unit), which is a heat generation part of a laptop computer. A heat slinger is welded to the other terminal as a condensation part, and the heat slinger is contacted to a heat slinger disposed on the back side of a liquid crystal display.

By the above structure, heat generated from CPU of the laptop computer is transferred to the condensation part by evaporation of the working liquid, $C_4F_9C_2H_5$, and heat is diffused through the heat slinger, while the gasified working liquid is condensed and liquefied. The liquefied $C_4F_9C_2H_5$ flows through a wig of the mesh structure by a capillary force, and it is circulated to the evaporation part.

By the above structure, the laptop computer can be constructed to be very compact, and its heat radiation property is excellent as compared with conventional ones. Further, a computer excellent in durability in cold district and high temperature district can be provided.

INDUSTRIAL APPLICABILITY

The working liquid of the present invention can be used for cooling semiconductor devices used for computers, communication apparatuses, rectifiers, motors or the like, electronic equipments, electronic power equipments or the like and cooling for bearings used for lathes, ball lathes or the like, or used for heat exchangers for air conditioner.

The entire disclosure of Japanese Patent Application No. 2006-105312 filed on Apr. 6, 2006 including specification, claims, drawings and summary is incorporated herein by reference in its entirety.

What is claimed is:

1. A method for operating a latent heat transport apparatus comprising providing a working liquid for a latent heat transport apparatus, which comprises a compound of the formula $C_6F_{13}C_2H_5$
wherein the operation temperature is from −50 to 200° C.

2. The method for operating a latent heat transport apparatus according to claim 1, wherein the latent heat transport apparatus is a heat pipe.

3. The method according to claim 1, wherein the content of the compound is at least 50 mass % in the working liquid.

4. The method according to claim 1, wherein the working liquid further comprises an alcohol.

5. The method according to claim 4, wherein the alcohol is a $C_{1-4}$ alcohol.

6. The method according to claim 4, wherein the content of the compound is from 90 to 99 mass %, and the content of the alcohol is from 1 to 10 mass %.

7. The method according to claim 6, wherein, wherein the $C_{1-4}$ alcohol is at least one alcohol selected from the group consisting of methanol, ethanol, 1-propanol, 2-propanol and n-butanol.

8. The method according to claim 1, wherein the working liquid further comprises at least one stabilizer selected from the group consisting of an antioxidant, a heat resistant agent and a metal deactivator.

9. The method according to claim 1, wherein the working liquid is an azeotropic composition.

10. The method according to claim 1, wherein the working liquid further comprises at least one hydrocarbon that is a linear or branched $C_{6-8}$ hydrocarbon or a cyclic saturated hydrocarbon.

11. The method according to claim 1, wherein the working liquid further comprises at least one hydrocarbon that is n-pentane, cyclopentane, n-hexane, or n-heptane.

12. The method according to claim 1, wherein the working liquid further comprises at least one member selected from the group consisting of a hydrocarbon, a fluoroalcohol, a ketone, and a fluoroether.

13. The method according to claim 12, wherein the working liquid further comprises an alcohol.

* * * * *